(12) United States Patent
Nishimura

(10) Patent No.: US 7,220,959 B2
(45) Date of Patent: May 22, 2007

(54) DIFFERENTIAL COLOR SENSOR WITHOUT FILTERS

(75) Inventor: Ken A. Nishimura, Fremont, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/919,593

(22) Filed: Aug. 16, 2004

(65) Prior Publication Data

US 2006/0043265 A1   Mar. 2, 2006

(51) Int. Cl.
G01J 3/50 (2006.01)
H01J 40/14 (2006.01)
H01J 5/16 (2006.01)
H01L 31/00 (2006.01)

(52) U.S. Cl. ............ 250/226; 250/214.1; 356/402

(58) Field of Classification Search ............ 250/214 R, 250/214.1, 226; 356/402, 421, 406–407, 356/425

See application file for complete search history.

(56) References Cited

U.S. PATENT DOCUMENTS

| | | | | |
|---|---|---|---|---|
| 4,309,604 A | * | 1/1982 | Yoshikawa et al. | 250/226 |
| 4,778,987 A | * | 10/1988 | Saaski et al. | 250/226 |
| 5,436,493 A | * | 7/1995 | Mantell | 257/440 |
| 5,508,512 A | * | 4/1996 | Gray et al. | 250/226 |

OTHER PUBLICATIONS

David L. Gilblom, Alternative Corporation, P. O. Box 4055, Los Altos, CA, USA 94024-1055; Sang Keun Yoo, HanVision Co., LTd., KAIST-AVH, 373-1, Guseong-dong, Yuseong-gu, Daejeon, R.O. Korea; Peter Ventura, Foveon, Inc., 2820 San Tomas Expressway, Santa Clara, CA, USA 95051; "Operation And Performance Of A Color Image Sensor With Layered Photodiodes", Copyright 2003 Society Of Photo-Optical Instrumëntation Engineers; 7 Pages.

* cited by examiner

Primary Examiner—Georgia Epps
Assistant Examiner—Patrick J. Lee

(57) ABSTRACT

A semiconductor color sensor implemented without the use of color filters. Fabricating photodiodes using different semiconductor materials provide photodiodes with different sensitivities vs. wavelengths. A first embodiment uses photodiodes with different junction depths. A shallow junction depth produces a photodiode with its sensitivity peak in shorter wavelengths, while a deeper junction depth produces a photodiode with its sensitivity peak in longer wavelengths. Amorphous as well as crystalline structures may be used. A second embodiment uses photodiodes with different materials, such as Silicon-Germanium (SiGe) which has a longer wavelength peak sensitivity, and Silicon (Si) which has a shorter wavelength peak sensitivity in comparison. More than two photodiodes having different wavelength sensitivities may be used. Sensing current ratios between pairs of diodes allows color balance to be maintained.

5 Claims, 3 Drawing Sheets

DIFFERENTIAL COLOR SENSOR WITHOUT FILTERS

TECHNICAL FIELD

Embodiments in accordance with the invention are related to solid-state color sensors.

BACKGROUND

Sensing the spectral content of incident light is important in many arenas, for example in determining and/or maintaining color balance in displays comprised of light emitting diode (LED) displays of different colors.

One approach to such sensing as known to the art involves a plurality of photodiodes combined with filters which selectively pass light of predetermined wavelengths. The performance of such sensors is limited by the accuracy of the light transmission characteristics of the filters, and the long-term performance is limited by the long-term stability of the filters. Sensitivity is also impacted by filters, as they are typically absorptive. Furthermore the selectivity of such color sensors is usually limited by the availability of filtering materials.

SUMMARY OF THE INVENTION

A first photodiode sensor with a sensitivity peak in the shorter wavelengths and a second photodiode sensor with a sensitivity peak in the longer wavelengths are used to monitor the spectral content of incident light. Shifts in spectral content will cause the ratio of photocurrents between the first and second sensors to change. Measuring the ratio is preferred to absolute measurements.

DETAILED DESCRIPTION OF THE EMBODIMENTS

Germanium

According to the present invention, a differential color sensor uses a first photodiode sensor with a sensitivity peak in shorter wavelengths and a second photodiode sensor with a sensitivity peak in longer wavelengths to monitor the spectral content of incident light.

In a first embodiment of the invention, different semiconductor materials are used. A first embodiment uses a Silicon (Si) photodiode, which has its sensitivity peak in shorter wavelengths, and a Silicon-Germanium (SiGe) photodiode, which has its sensitivity peak in the longer wavelengths.

In a second embodiment of the invention, photodiodes with different junction depths are used. A photodiode with a shallow junction depth has its sensitivity peak in shorter wavelengths, and a photodiode with a deeper junction depth has its sensitivity peak in longer wavelengths.

Figure 1:
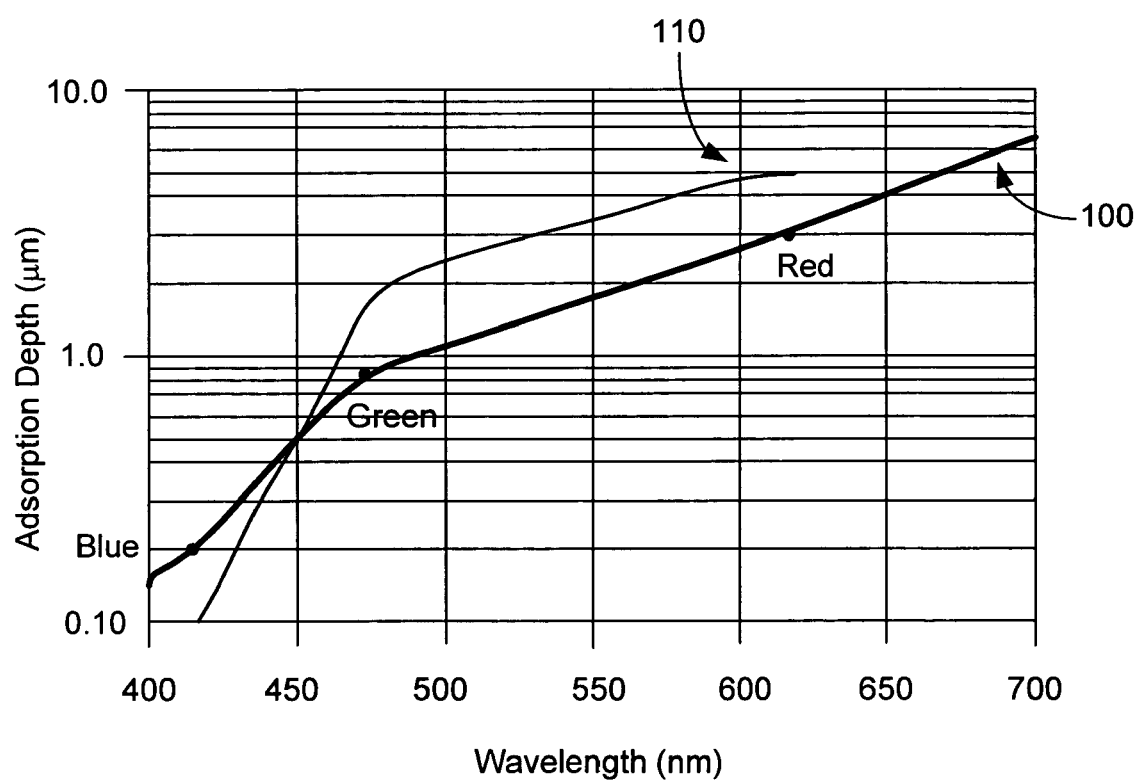
FIG. 1 shows absorption depth vs. wavelength for Silicon (Si) and Silicon-Germanium (SiGe)

These differences are shown in FIG. 1, which shows Silicon photo absorption depths with respect to wavelengths. Curve 100 shows absorption depths for Silicon, with red, green, and blue indicated. Curve 110 shows absorption depths for Silicon-Germanium (SiGe, 20% Ge). This shows that color sensors with differing junction depths, for example, 0.2 um, 0.8 um, and 3.0 um in Silicon can provide good color sensors, and the response difference between Silicon and Silicon-Germanium photodiodes.

In a third embodiment of the invention, or in combination with previously disclosed embodiments, amorphous material may be used in photodiodes, as well as more common crystalline structures.

Using a pair of photodiodes as a color sensor, two separately packaged diodes may be used. Integration may be furthered by packaging two distinct diodes in one optical package, and improved further by fabricating both diodes on the same die.

In a first embodiment, photodiodes with different sensitivities vs. wavelengths may be implemented without the use of color filters by fabricating photodiodes using different semiconductor materials. Semiconductor materials with differing bandgap voltages will have different sensitivity vs. wavelength properties, such as the difference between pure Silicon (Si), and Silicon-Germanium (SiGe). As an example, using two diodes each with a junction depth of 0.5 um in Silicon and Silicon-Germanium will produce different spectral peak responses, as evident from FIG. 1.

In a second embodiment, photodiodes with different sensitivities vs. wavelengths may be implemented by altering the photodiode junction depth. A shallow junction depth produces a photodiode with its sensitivity peak in shorter wavelengths, while a deeper junction depth produces a photodiode with its sensitivity peak in longer wavelengths.

Amorphous materials may also be used, as a third embodiment, or in combination with other embodiments. As an example, amorphous photodiodes may be used with differing junction depths. Amorphous diodes such as amorphous Silicon and amorphous Silicon-Germanium may be used.

Figure 2:
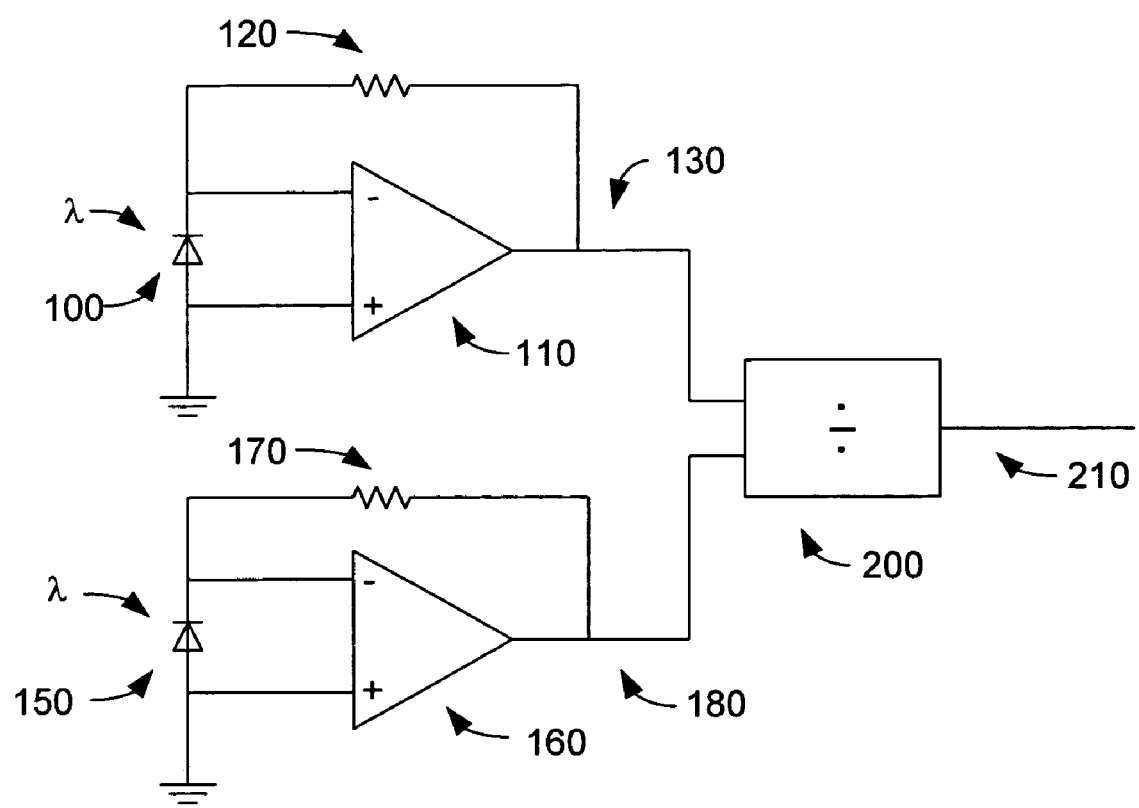
FIG. 2 shows ratio determination by analog means.

In application, as shown in FIG. 2, photodiode 100 drives transimpedance amplifier 110, which has its gain set by feedback resistor 120. This transimpedance amplifier converts photocurrent from photodiode 100 to a voltage output 130. With a feedback resistor 120 of 1 megOhm, this output is 1 volt per microAmp of photodiode current. Similarly, photodiode 150 drives transimpedance amplifier 160, with feedback set by resistor 170, producing voltage output 180. These two voltages feed ratio circuit 200, producing a voltage ratio at output 210. Various ratio circuits may be used, as will be apparent to one skilled in the art. One such ratio circuit is shown on page 31 of *Application Note* 31 *Op Amp Circuit Collection*, published by National Semiconductor Corporation, September 2002. Four-quadrant analog multipliers, such as the AD633 from Analog Devices may also be used. Similarly, other current to voltage converters may be used with photodiodes 100 and 150, such as shown on page 3 of the aforementioned *Application Note* 31 *Op Amp Circuit Collection*. The sum of the photocurrents, which may be calculated as a weighted sum, may be used as an indication of intensity.

Figure 3:
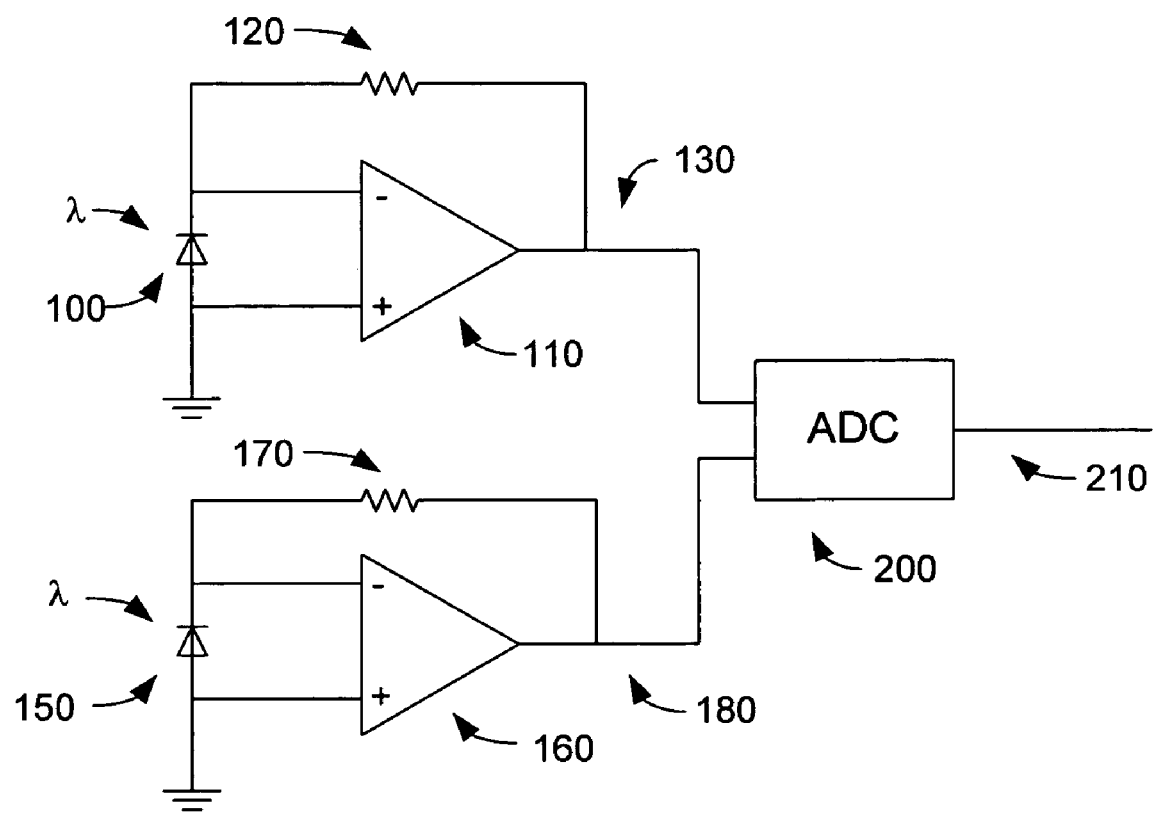
FIG. 3 shows ratio determination by digital means.

As shown in FIG. 3, the ratio of the two photocurrents may also be produced in digital fashion. Photodiodes 110 and 150 drive transimpedance amplifiers 110 and 160 as in FIG. 3, producing voltage outputs for the two photodiodes. These voltages are fed to analog to digital converter (ADC) 200, which converts the analog voltages to digital form. Suitable ADCs are made by companies such as Linear Technologies. Multiple single-channel ADCs, an analog multiplexer feeding a single-channel ADC, or a multiple-channel ADC may be used. A custom analog to digital converter could integrate the transimpedance amplifiers, or eliminate them entirely. The digital values of the input voltages are then handled by a microprocessor, not shown, to derive the ratio.

By using either an analog or a digital control loop to hold the ratio constant while driving a plurality of different color emitters such as light emitting diodes or laser diodes, color may be held constant. Digital schemes such as the well-known PID controller (Proportional, Integral, Derivative) may be used in digital form.

While the embodiments of the present invention have been illustrated in detail, it should be apparent that modifications and adaptations to these embodiments may occur to one skilled in the art without departing from the scope of the present invention as set forth in the following claims.

The invention claimed is:

1. An improved color sensor, comprising:
   a first semiconductor photodiode of a first material comprising silicon with a sensitivity peak at a first wavelength;
   a second semiconductor photodiode of a second material comprising silicon-germanium with a sensitivity peak at a second wavelength;
   a first amplifier associated with the first semiconductor photodiode and configured to develop a first voltage signal based on a photocurrent of the first semiconductor photodiode;
   a second amplifier associated with the second semiconductor photodiode and configured to develop a second voltage signal based on a photocurrent of the second semiconductor photodiode; and
   a circuit configured to develop a ratio between the first voltage signal and the second voltage signal, the ratio representative of the outputs of the first semiconductor photodiode and the second semiconductor photodiode.

2. The improved color sensor of claim 1 where the first and second photodiodes are combined in the same package.

3. The improved color sensor of claim 1 where the first and second photodiodes are fabricated on the same die.

4. The improved color sensor of claim 1 where the first and second photodiodes have different junction depths.

5. The improved color sensor of claim 1 where the first photodiode is an amorphous diode.

* * * * *